US009448591B2

United States Patent
Leong et al.

(10) Patent No.: US 9,448,591 B2
(45) Date of Patent: Sep. 20, 2016

(54) COMPLIANT BATTERY SUPPORTS FOR DEVICE TESTING

(71) Applicant: Microsoft Corporation, Redmond, WA (US)

(72) Inventors: Eric M. Leong, Kirkland, WA (US); John Terpsma, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 222 days.

(21) Appl. No.: 14/187,181

(22) Filed: Feb. 21, 2014

(65) Prior Publication Data

US 2015/0241923 A1 Aug. 27, 2015

(51) Int. Cl.
| | |
|---|---|
| G06F 1/16 | (2006.01) |
| B32B 37/12 | (2006.01) |
| H05K 5/00 | (2006.01) |
| B32B 37/18 | (2006.01) |
| H01M 2/10 | (2006.01) |

(52) U.S. Cl.
CPC .......... *G06F 1/1635* (2013.01); *H01M 2/1022* (2013.01); *H05K 5/0086* (2013.01); *H01M 2220/30* (2013.01); *Y10T 29/49004* (2015.01)

(58) Field of Classification Search
CPC ......... H01M 2/1686; H01M 10/0472; H01M 2/08; H01M 2/1022; B32B 2457/00; B32B 2457/10; B32B 37/12; B32B 7/12; H04M 1/0254; H04M 2001/0204; H05K 5/0086; H05K 5/0247; Y10T 29/49004; Y10T 29/49114
USPC ......... 429/96–100, 123; 361/679.01, 679.55, 361/679.56, 749, 728, 760; 312/223.1, 312/223.2; 174/254, 255, 256, 259, 260; 439/59–69
See application file for complete search history.

(56) References Cited

U.S. PATENT DOCUMENTS

| | | | | |
|---|---|---|---|---|
| 4,778,702 | A | 10/1988 | Hutter | |
| 7,172,676 | B2 | 2/2007 | DeMeter | |
| 7,396,238 | B2 * | 7/2008 | Jeong | G06F 1/1616 439/86 |
| 7,524,390 | B2 | 4/2009 | DeMeter et al. | |
| 8,345,420 | B2 | 1/2013 | McClure et al. | |
| 8,884,889 | B2 * | 11/2014 | Beom | G06F 3/041 156/291 |
| 2002/0193154 | A1 * | 12/2002 | Trosper | H01M 2/1044 455/572 |
| 2005/0148984 | A1 * | 7/2005 | Lindsay | A61F 13/5611 604/387 |
| 2008/0037770 | A1 * | 2/2008 | Emmert | H04M 1/026 379/433.01 |

(Continued)

OTHER PUBLICATIONS

STIC Search, Dec. 23, 2015.*

*Primary Examiner* — Courtney Smith
*Assistant Examiner* — Michael Matey
(74) *Attorney, Agent, or Firm* — Qudus Olaniran; Judy Yee; Micky Minhas

(57) ABSTRACT

Compliant supports hover a battery above pressure sensitive adhesive (PSA) when testing a computing device and before the battery is bonded to an enclosure. The compliant supports are placed along a surface of the enclosure such that at least a portion of each of the compliant supports extends above the PSA. The compliant supports apply an upwards force on the battery to maintain a gap between the battery and the PSA. After electrical testing of the computing device, the battery is brought into contact with the PSA while retaining at least one of the compliant supports in the enclosure. In some embodiments, a downwards force is applied to the battery to overcome the upwards force from the compliant supports.

20 Claims, 16 Drawing Sheets

(56) References Cited

U.S. PATENT DOCUMENTS

| | | | |
|---|---|---|---|
| 2008/0165139 A1* | 7/2008 | Hotelling | G06F 3/041 345/173 |
| 2008/0170362 A1* | 7/2008 | Micewicz | G11B 25/043 361/679.33 |
| 2008/0246741 A1* | 10/2008 | Hinata | G06F 3/045 345/173 |
| 2008/0275327 A1 | 11/2008 | Faarbaek | |
| 2009/0229732 A1 | 9/2009 | Determan | |
| 2010/0053854 A1* | 3/2010 | Nishikawa | G06F 1/1626 361/679.01 |
| 2011/0176283 A1* | 7/2011 | Takei | H01M 2/1066 361/752 |
| 2012/0194997 A1* | 8/2012 | McClure | G06F 1/1626 361/679.55 |
| 2012/0194998 A1* | 8/2012 | McClure | H01Q 1/243 361/679.56 |
| 2013/0021280 A1* | 1/2013 | Dabov | G06F 1/1626 345/173 |
| 2014/0355207 A1* | 12/2014 | Stephens | H01M 10/425 361/679.55 |

* cited by examiner

COMPLIANT BATTERY SUPPORTS FOR DEVICE TESTING

BACKGROUND

Mobile computing devices provide various functionality in a limited device space or form factor. In particular. such devices are thin and light. In some devices, pressure sensitive adhesive (PSA) is used to hold components in a device enclosure or housing. For example, the battery is bonded directly to the device enclosure using the PSA. After bonding the battery to the device enclosure, functional testing is performed on the device. If problems are detected during the testing, it becomes difficult with the existing systems to remove the battery and complete repairs without deforming or damaging the battery, device enclosure, or other components in the device due to the PSA bond. Thus, with the existing systems, the same battery, enclosure, or other components in the device become unusable at least for safety reasons and must be discarded. As such, the existing systems have a high cost of re-work when there are failures that require removal of the battery or components routed under the battery.

To overcome this problem, some existing system affix the battery to the mobile device enclosure using removable release liners or removable fixtures to prevent the battery from contacting the PSA during testing. In such cases, temporary adhesive may be used to attach the battery to the fixtures. However, removing the fixtures after testing and bonding the battery to the device enclosure via the PSA are time-consuming tasks for completion by skilled operators. Further, there is a risk of the battery connection of the existing systems becoming partially or fully disconnected when attempting to perform repairs to the device after testing, at least because the battery is not in its final position while on the fixtures and there is no mechanism allowing movement of the battery while on the fixtures. In some cases, the battery flexible printed circuit (FPC) is made longer so that the battery can be lifted higher while removing the release liners or the fixtures. However, using a longer battery FPC adds to the cost of the product. As such, with the existing systems, removing the battery to correct errors detected during testing entails skilled operations with high material and labor costs.

SUMMARY

In embodiments of the disclosure, pressure sensitive adhesive (PSA) is applied on a surface of a battery enclosure of a computing device. One or more compliant supports are placed along the surface of the battery enclosure such that at least a portion of each of the compliant supports extends above the PSA. The compliant supports apply an upwards force to hover a battery above the PSA while preventing the battery from coming in contact with the PSA. The compliant supports compress and/or collapse to enable the battery to bond to the battery enclosure via the PSA. For example, a downwards force may be applied to the battery to overcome the upwards force to bond the battery to the PSA while retaining at least one of the one or more compliant supports.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
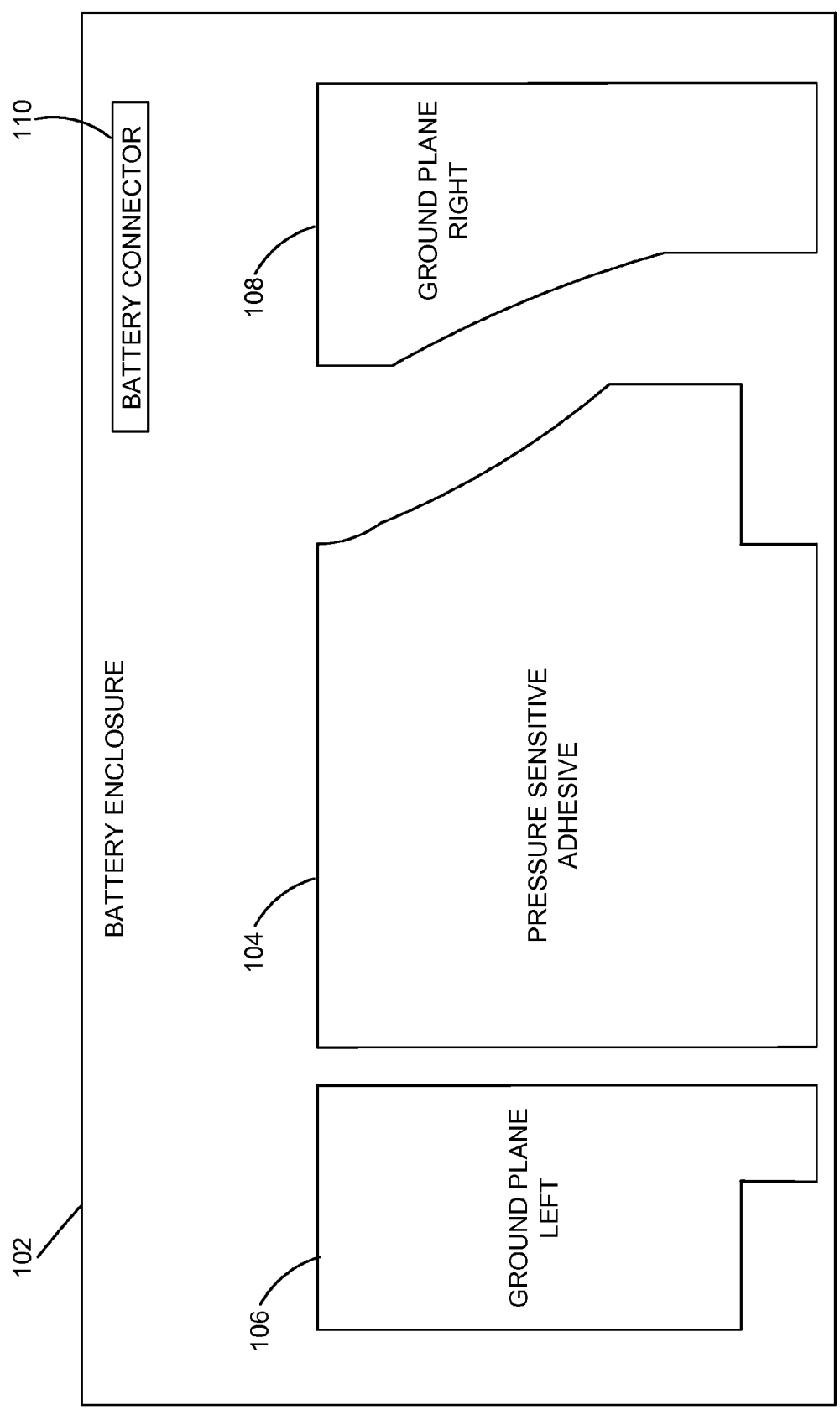
FIG. 1 is an exemplary schematic diagram illustrating application of pressure sensitive adhesive (PSA) and fitment of ground planes and a battery connector in a battery enclosure of a computing device.

Referring to the figures. embodiments of the disclosure enable positioning a battery of a computing device to prevent contact with pressure sensitive adhesive (PSA). In some embodiments, compliant supports are disposed along a battery enclosure to hold the battery in connection with a battery connector for functional testing of the computing device. The compliant supports compress slightly when the battery is placed on the compliant supports, and produce an upward force (e.g., a first force) to support the battery above the PSA as shown, for example, in FIG. 6.

Aspects of the disclosure enable the battery to be placed in a location that is proximate or otherwise near to the desired final location of the battery in the battery enclosure of the computing device. The compliant supports further enable translational movement of the battery in X and Y directions, as well as rotational movement in a Z direction. This movement capability imparts an ability to maneuver the placed battery to re-position it for connection with a battery connector in the battery enclosure. Further, in some embodiments, none of the compliant supports are removed during final fitment of the battery after testing. For example, a pre-defined amount of pressure is applied above the battery to produce a downwards force (e.g., a second force) that overcomes the upwards force exerted by the compliant supports. The battery then comes into contact with the PSA for bonding to the battery enclosure without removing any of the compliant supports. In other embodiments, at least one, but potentially not all, of the compliant supports are removed during final fitment of the battery into the battery enclosure.

Aspects of the disclosure enable functional testing of the computing device at a production facility without the battery being bonded to the battery enclosure using PSA, and without using any removable release liners and/or removable fixtures to prevent the battery from contacting the PSA during the testing. If, during the functional testing, any failures are encountered and some components of the computing device need repair or replacement, the battery may be easily removed without any damage and/or deformation to the battery and/or the battery enclosure. Further, the battery enclosure as well as any other components do not suffer any damage during the process of removing the battery. For example, after rectification of any failures detected during testing, the same battery, the battery enclosure, and/or the components that did not need any rectification may still be used in the computing device. In this manner, aspects of the disclosure reduce the cost of repairs at least because the battery may be easily removed to allow access to other components under the battery upon detection of failures therein.

Additionally, because no removable fixtures are used for the temporary fitment of the battery for device testing in some embodiments, no time-consuming, skilled, and potentially damaging operations need to be performed.

The battery may be bonded to the battery enclosure using the previously-applied PSA after the functional testing (e.g., if no rectification is desired or needed during the functional testing). In some embodiments, functional testing using the battery is performed after other components have been fitted in the computing device and tested. If, during the functional testing with the battery engaged with the compliant supports, all the parameters of the computing device are found to be within acceptable limits, then the battery may be bonded to the battery enclosure using the PSA that was pre-applied to the battery enclosure. In this embodiment, a pre-defined amount of pressure (e.g., 20 pounds per square inch) is applied on the battery to press it down and come in contact with the pre-applied PSA. The pressure is maintained for a pre-defined period of time (e.g., 20 seconds).

The applied pressure overcomes the upward (or outward) force of the compressed compliant supports and compresses the compliant supports (e.g., further) to shrink the compliant supports and to allow the battery to be bonded to the device enclosure via the PSA. When no problems are encountered during functional testing, the operations of functional testing and final assembly may be dovetailed.

Referring to FIG. 1, an exemplary schematic diagram illustrates PSA 104 placed at the designated location in a battery enclosure 102 of a computing device. The PSA 104 may, in some embodiments, have a top release liner and a bottom release liner that are removed when the PSA 104 is inserted in, or applied to, the battery enclosure 102. FIG. 1 further illustrates a left ground plane 106 and a right ground plane 108. The left and right ground planes may, for example, be radio frequency (RF) ground planes. In some embodiments, only the ground plane left 106 and the PSA 104 bond the battery 304 to the battery enclosure 102. FIG. 1 also shows battery connector 110 to which the battery 304 is connected during functional testing and thereafter.

The computing device may include, but is not limited to, various mobile computing devices such as mobile phones, personal digital assistants, pagers, tablets, messenger devices, hand-held computing devices, pocket translators, e-books, bar code readers. smart phones, computing pads, netbooks. gaming devices, portable media players, head-mounted devices, and the like. The computing device may also include less portable devices such as desktop personal computers, kiosks, tabletop devices, industrial control devices, wireless charging stations, and electric automobile charging stations.

Figure 2:
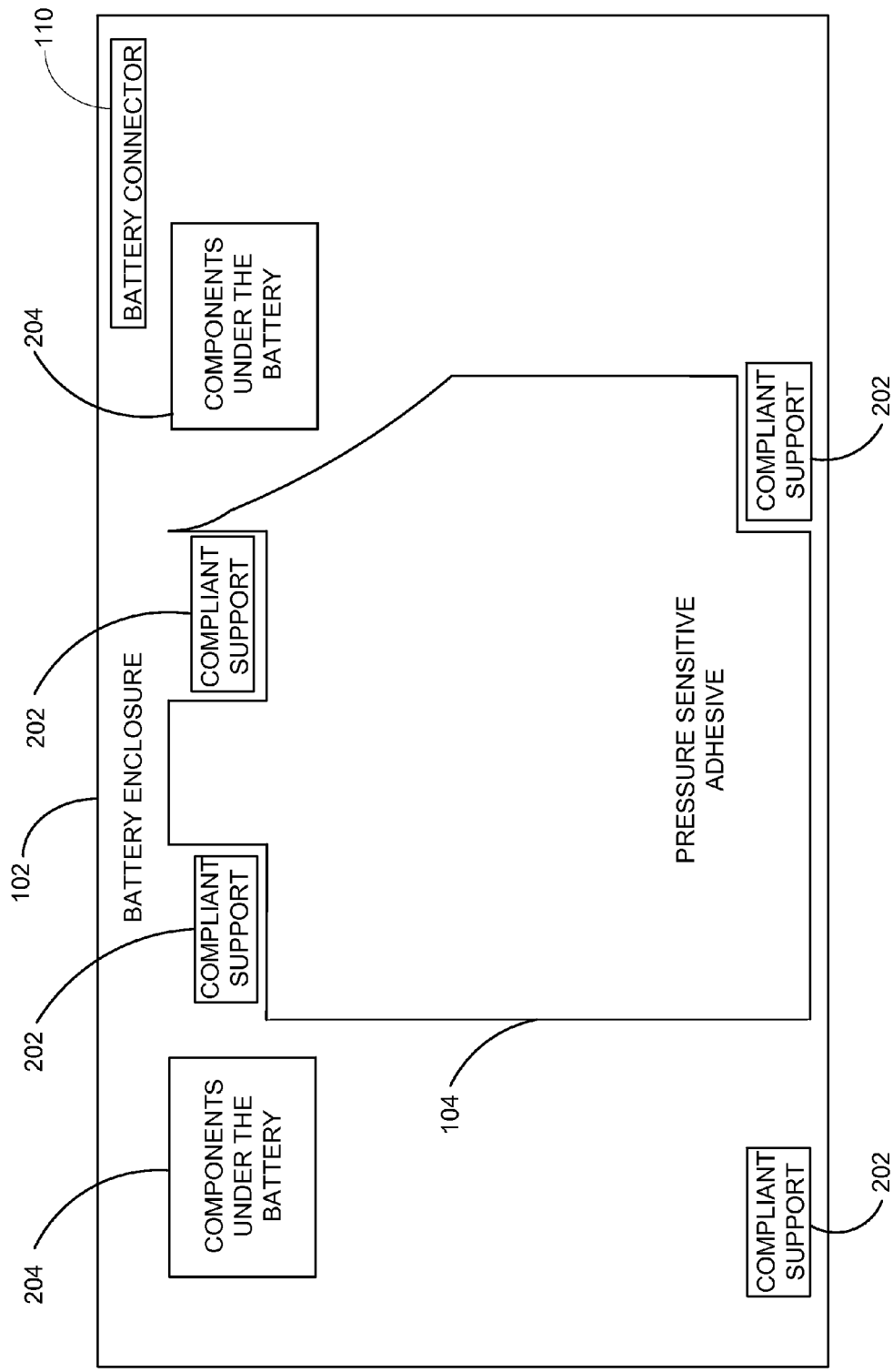
FIG. 2 is an exemplary schematic diagram illustrating general arrangement of compliant supports. the PSA, and components that lie below the battery connector in the battery enclosure of the computing device.

Referring next to FIG. 2, an exemplary schematic diagram illustrates four compliant supports 202 placed in designated locations in the battery enclosure 102. However, less than or more than four compliant supports may be used. The compliant supports 202, having a quadrilateral shape, are shown in FIG. 2 as rectangles. However, aspects of the disclosure are operable with various other shapes and sizes of the compliant supports. Further, exemplary items may be visible or invisible in the battery enclosure 102. For example, FIG. 2 depicts components 204 that are earmarked to be put under the battery 304 when fitted. The figure also illustrates the PSA 104, placed in its designated location, to be used for final bonding of the battery with the battery enclosure 102. The battery enclosure 102 has been fitted with operational components for functional testing except the battery 304. The battery enclosure 102 is, therefore, ready for placement of the battery 304 on the compliant supports 202 for functional testing.

The battery 304, when engaged with the compliant supports 202, is supported and attachable to the compliant supports 202 but above the PSA 104 (e.g., without touching it). For example, the compliant supports 202 are firm enough to hold up the weight of the battery 304 to prevent contact between the battery 304 and the PSA 104, but soft enough to not exert significant repelling force when compressed (e.g., when the battery 304 bonds to the PSA 104). Significant repelling force may reduce battery bond strength during reliability testing. An optimum gap, such as 0.2-0.6 millimeters (mm) is maintained between the PSA 104 and the battery 304 during functional testing, in some embodiments. This gap is a function of different factors, including the weight of the battery, the dimensions and shape of the compliant supports, the material of the compliant supports, the quantity of compliant supports used, the density of the compliant supports and the compression modulus of the compliant supports.

By the terms "supported attachable" or "supported connectable" or "supported insertable", the battery 304 may be temporarily attached, supported, connected, or otherwise placed in the battery enclosure 102 in such a way that the risk of unintentionally separating the battery 304 from the battery enclosure 102 is minimal. However, the battery 304 and the compliant supports are attached in such a way that they may be separated when desired, and the battery may be removed from the battery enclosure 102 without damaging the battery 304, the compliant supports, the battery enclosure 102, and/or other components.

FIG. 2 shows an exemplary quantity of four compliant supports 202 that may be used in some embodiments. However, more than or less than four pieces of the compliant supports may be used. Further, while all the compliant supports may be identical in some embodiments, each or some of the compliant supports may have different shapes, sizes, dimensions, material, and/or other properties in other embodiments. The compliant supports 202 are shown outside the PSA 104 in FIG. 2. However, one or more of the compliant supports 202 may be arranged on the PSA 104. Further, while the PSA 104 is shown as one piece in FIG. 2, the PSA 104 may be comprised of a plurality of pieces of PSA.

Figure 3:
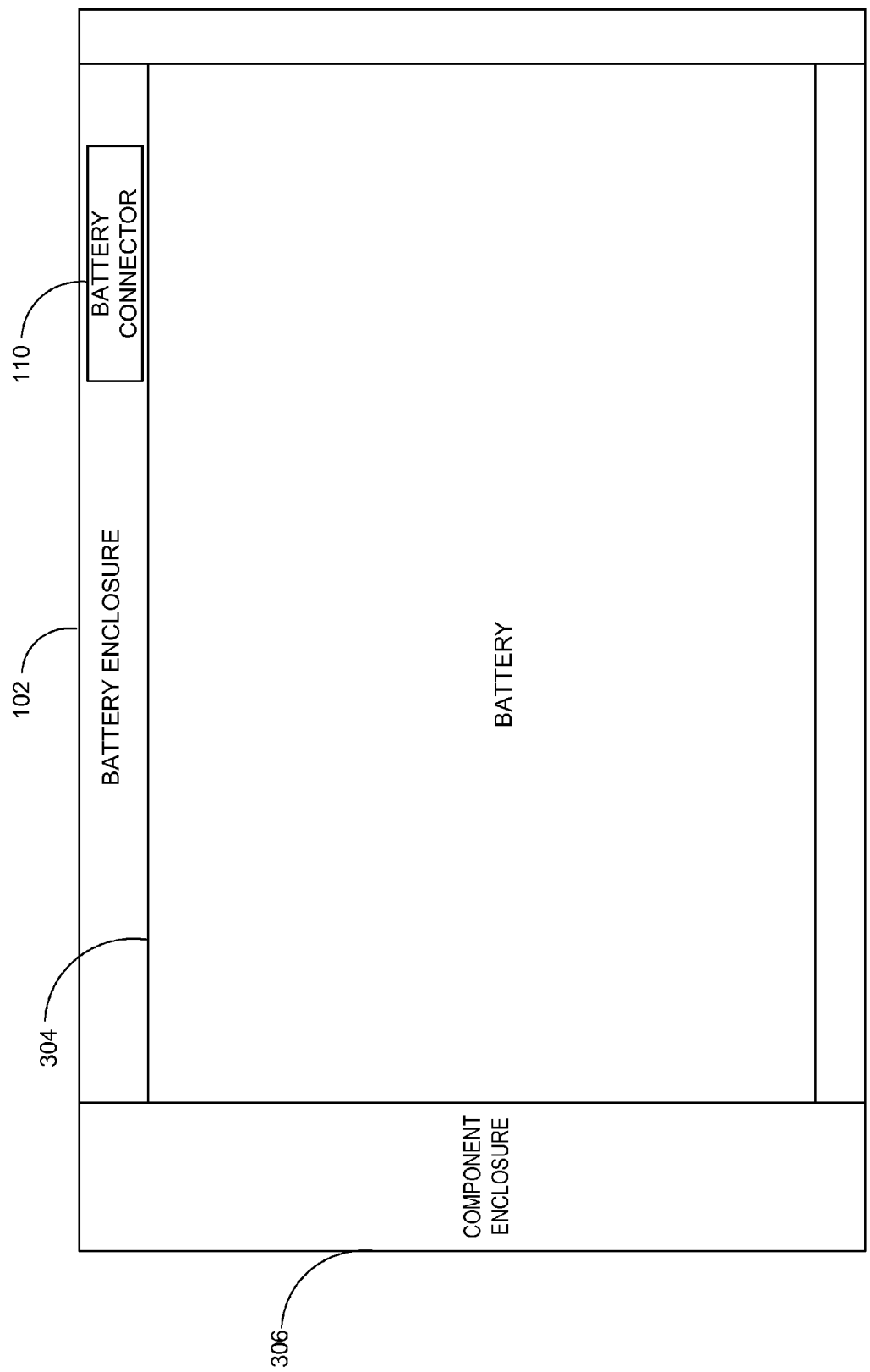
FIG. 3 is an exemplary schematic diagram illustrating general arrangement of the battery having been placed proximate to the final designated location using compliant supports.

FIG. 3 is an exemplary schematic diagram illustrating the battery 304, when placed proximate to its final designated location in the battery enclosure 102 after successful testing (or completion of repairs). FIG. 3 also shows other exemplary locations and components such as a component enclosure 306 and a battery connector 110. The battery 304 is axially translatable in the X and Y directions, and rotationally moveable within the battery enclosure 102 in Z direction. Even though the battery 304 is placed proximate to its final designated position in this example, it may not align with datum lines marked in the mobile computing device housing. The datum lines indicate the final designated position of the battery 304 for connection with the battery connector 110. Because the compliant supports have flexibility (e.g., compliance) and the battery 304 is not touching the PSA 104, aspects of the disclosure enable the battery 304 to have translational and rotational maneuverability. This maneuverability enables the battery to be aligned with the datum lines in the battery enclosure 102, and be positioned above or otherwise near its designated location before final bonding with the PSA 104.

Figure 4A:
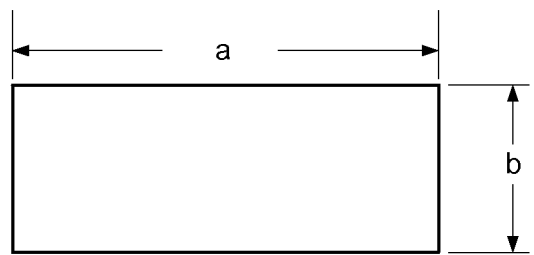
FIG. 4A-4C are exemplary schematic diagrams illustrating an exemplary embodiment of a compliant support using foam and double sided adhesive.
Figure 4B:
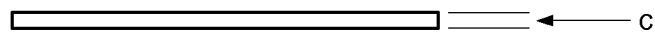
Figure 4C:
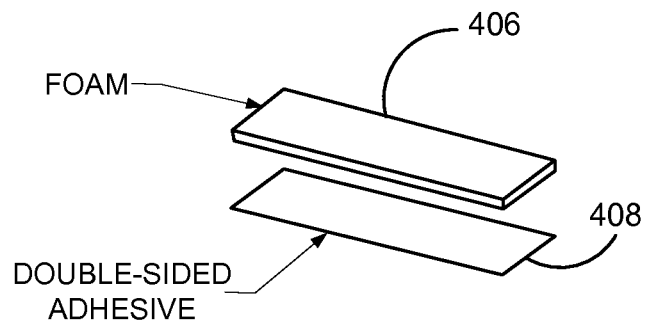

FIG. 4A to 4C depict an exemplary embodiment of the compliant supports 202. In this implementation of the compliant supports 202, a quadrilateral piece of foam 406 is used as a compliant support. The exemplary material used is Nitto Denko SCF100 available from Nitto Denko of Japan. The length and breadth of the compliant supports 202 is "a" and "b" respectively. The thickness of the compliant supports 202 is "c." The compliant supports 202 in this implementation have double-sided adhesive tape 408 applied to the compliant supports 202. Use of the double-sided adhesive tape 408 facilitates temporarily connecting (e.g., sticking) the compliant supports 202 to the battery enclosure 102, and temporarily connecting the battery 304 with the compliant supports 202 for and during functional testing. In one embodiment, a Nitto Denko double-sided adhesive tape is used for this purpose.

The range of the dimensions "a". "b". and "c" may vary substantially depending upon the size of the computing device, the size, shape, weight and type of the battery 304, the battery discharge rate during functional testing, the temperature rise of the battery 304 and the battery enclosure 102, the space available in the battery enclosure 102, and other factors. In an exemplary embodiment, length "a" is 1.5 centimeters (cm), breadth "b" is 0.5 cm, and thickness "c" is 0.8 mm (when uncompressed). The thickness of the PSA 104 is an example one of the criteria to determine "c". However, substantial variations in dimensions are possible in other embodiments of the disclosure without causing any problem in mechanical assembly and functional testing. For example, a compliant support may be non-rectangular, and may have any shape, irregular or regular.

In the exemplary case where the material of the compliant supports 202 is Nitto Denko SCF 100 and the values of "a", "b" and "c" are 1.5 cm, 0.5 cm, and 0.1 cm respectively, exemplary calculations for the gap between the PSA 104 and the battery 304 and the upwards force exerted by the compressed compliant supports 202 are next described. The compressive strength of Nitto Denko SCF 100 foam at 50% compression is approximately 1.2 N/cm$^2$. The area of each piece of the foam is shown in Equation (1) below.

$$1.5 \times 0.5 = 0.75 \text{ cm}^2 \quad (1)$$

The area of four foam pieces is shown in Equation (2) below.

$$4 \times 0.75 = 3 \text{ cm}^2 \quad (2)$$

Upwards force exerted by the foam pieces at 50% compression is shown in Equation (3) below.

$$1.2 \times 3 = 3.6 \text{ N} \quad (3)$$

The thickness of PSA 104 is 0.2 mm. At 50% compression, the available thickness of the foam is 0.5 mm. The gap between PSA 104 and battery 304 is shown in Equation (4) below, if a force of 3.6 N is applied.

$$0.5 - 0.2 = 0.3 \text{ mm} \quad (4)$$

Assuming the weight of the battery at 80 grams is approximately 0.8 N, and assuming a linear compression rate of the foam, the foam pieces are compressed as shown in Equation (5) below.

$$(0.8/3.6) \times 0.5 = 0.13 \text{ mm} \quad (5)$$

Hence, the actual gap between the battery and the PSA 104 in this example is shown in Equation (6) below.

$$1.0 - 0.13 - 0.2 = 0.67 \text{ mm} \quad (6)$$

However, other gaps are contemplated. For example, a gap of 0.2 mm between the battery and the PSA 104 is sufficient to keep the battery above (e.g., not contacting) the PSA 104 during testing, in some embodiments. Further, in some embodiments, when the battery 304 bonds to the PSA 104, the foam is compressed to 80% with rebound pressure against the bonded battery low enough to not weaken the integrity of the bond.

The above exemplary calculations show that a wide range of dimensions (e.g., thicknesses) of the compliant supports may be used with the disclosure. The Nitto Denko SCF100 foam is available at least in thickness varying from 0.5 to 1.0 mm. Accordingly, any suitable thickness may be chosen based on various factors, such as the weight of a given battery, the space available in a given battery enclosure, and suitable values for dimensions "a", and "b", and the quantity of foam pieces to be used as the compliant supports. Any other suitable foam (e.g., Nikko Denko SCF200, Nikko Denko SCF400, Nikko Denko SCF T100 or Nikko Denko P1500, or similar foams from other manufacturers) may be used to fabricate the compliant supports 202.

Figure 5A:
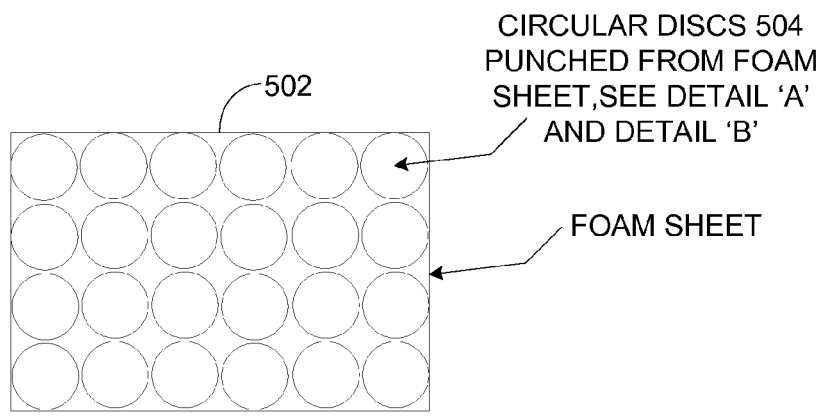
FIG. 5A-5C are exemplary schematic diagrams illustrating another exemplary embodiment of compliant supports using circular discs punched out of foam as compliant supports.
Figure 5B:
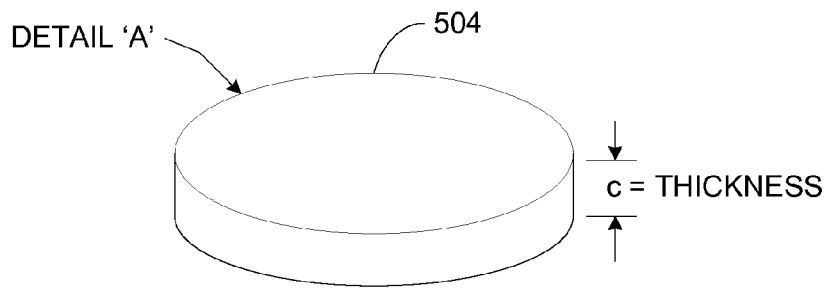
Figure 5C:
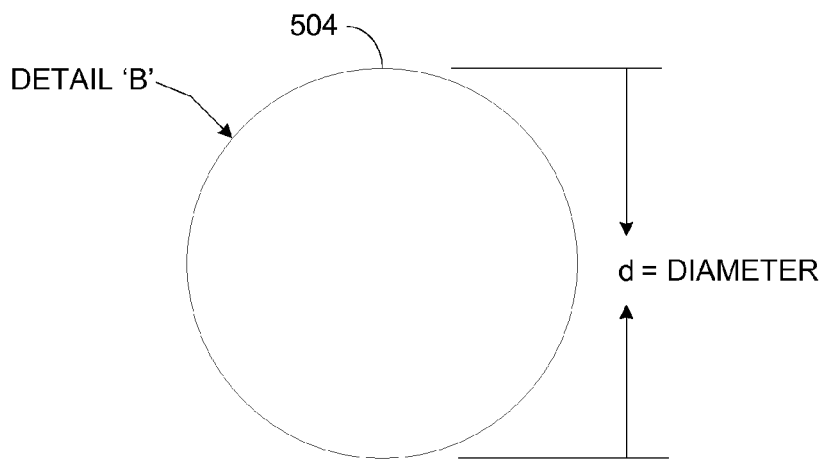

Further, other suitable shapes, apart from the rectangular shape already described herein, may be used. For example, as shown in FIGS. 5A-5C. circular discs may be used. The circular disks may be punched from a sheet of foam, or as available pre-made from a supplier. The quantity of pieces of the compliant supports to be used may be selected at least based on the weight and size of the battery, the temperature rise of the battery and the battery enclosure during testing, the space available in the battery enclosure, the material of the foam, and the production expediency.

FIGS. 5A-5C schematically illustrate punching circular discs 504 from a sheet of foam 502 to minimize wastage. Thickness of the disc "c" and the diameter of the disc "d" may be suitably chosen, based on at least the above-enumerated factors, to provide adequate gap and upwards force to support the battery 304 during testing.

Figure 6:
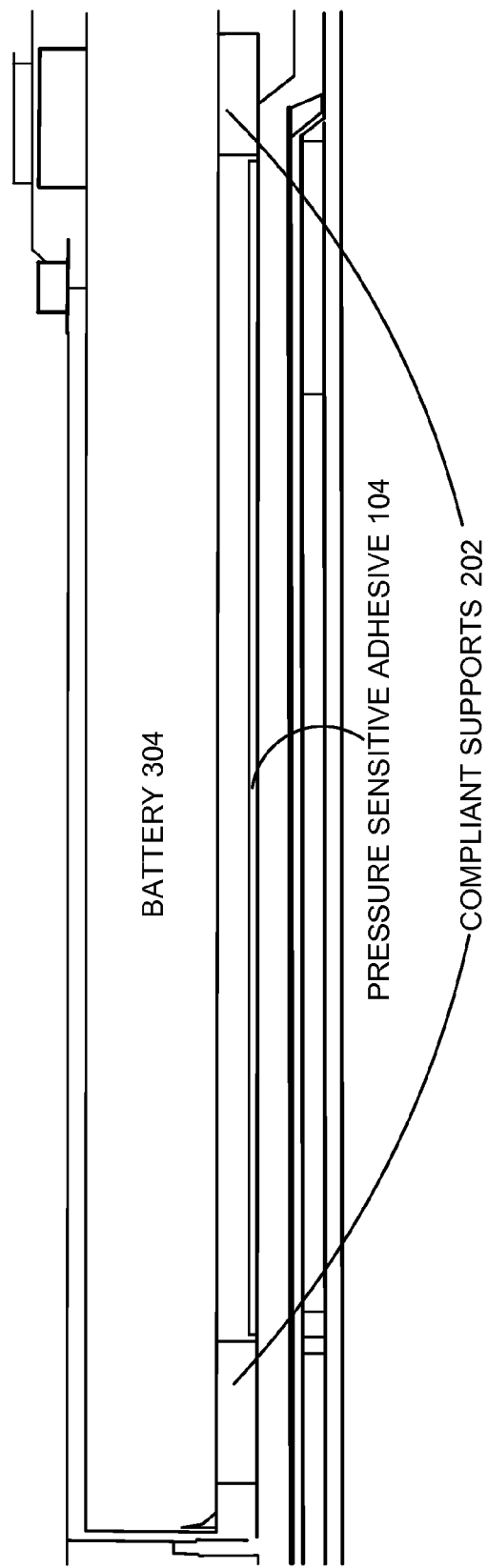
FIG. 6 is an exemplary schematic diagram illustrating a cross-sectional view of the battery enclosure showing the battery having been placed at the final designated location using the quadrilateral-shaped compliant supports shown in FIGS. 4A-4C and the battery being connected to a battery connector such that the assembly is ready for functional testing.

FIG. 6 is an exemplary schematic diagram illustrating usage of the compliant supports 202 supportably insertable inside the battery enclosure 102. The compliant supports 202 are attached to the battery enclosure 102 temporarily using, for example, double-sided adhesive tape 408. The battery 304 is placed proximate to its designated location inside the battery enclosure 102 above the compliant supports 202. The compliant supports 202 exert sufficient upwards force to support the battery above the PSA 104. In this condition, there is adequate gap between the PSA 104 and the battery. The battery is rotationally moveable and axially translatable to align with datum lines and to mate with the battery connector 110. The battery 304 temporarily attaches to, or otherwise engages, the compliant supports 202 such that there is little risk of unintentionally separating the battery 304 from the compliant supports 202 or the battery enclosure 102. However, if during functional testing of the computing device, some rectifications or other repairs to the device are desired, the battery may be removed from the battery enclosure 102 without any damage to the battery 304, the battery enclosure 102 and/or the operational components already installed inside the battery enclosure 102.

Figure 7:
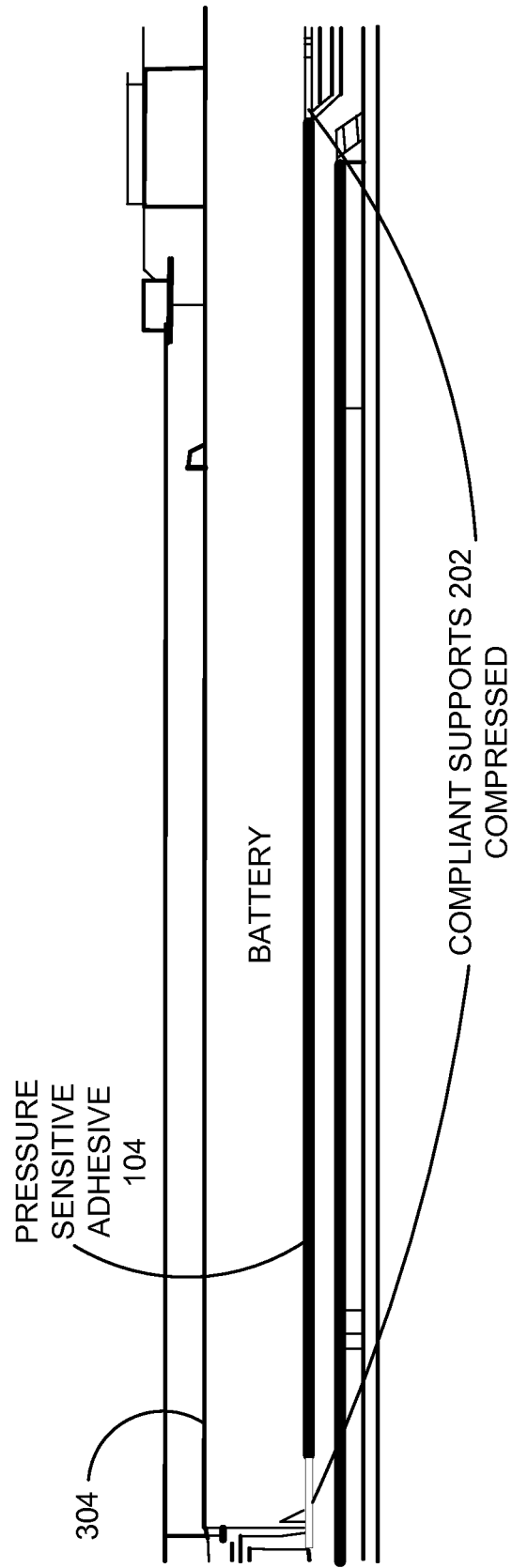
FIG. 7 is an exemplary schematic diagram illustrating a cross-sectional view of the mobile device assembly showing the battery having been pressed and bonded to the battery enclosure using the PSA.

FIG. 7 schematically illustrates an exemplary battery installation inside the battery enclosure 102 after satisfactory functional testing (e.g., no repairs needed). Once the functional testing has been satisfactorily completed, the battery 304 may be finally fitted inside the battery enclosure 102 using the PSA 104. In some embodiments, for battery 304 fitment, a pre-defined amount of downward force is applied above the battery 304 for a pre-defined period of time. The compliant supports 202 compress and the battery contacts the PSA 104 for a period of time (e.g. 20 seconds) that is sufficient to produce a relatively permanent, or semi-permanent bond between the PSA 104 and the battery 304. The upward force exerted on the battery 304 by the compliant supports 202 when compressed is less than the bonding force produced between the PSA 104 and the battery 304 such that the battery 304 remains bonded to the PSA 104 when the compliant supports 202 are compressed. Accordingly, the battery 304 is bonded to the battery enclosure 102 through the agency of the PSA 104.

Figure 8:
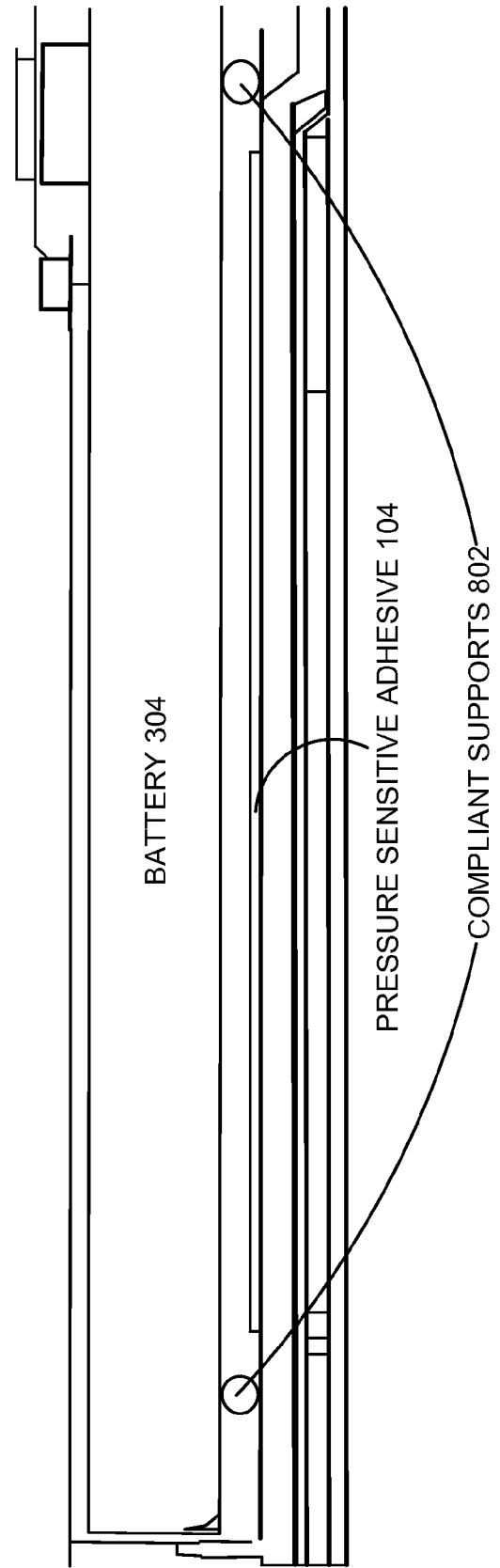
FIG. 8-FIG. 11 are exemplary schematic diagrams illustrating various other exemplary shapes of the compliant supports that may be used to support the battery during functional testing.

A wide variety of shapes, sizes, thicknesses and material may be used to fabricate compliant supports. A few exemplary shapes are shown in FIG. 8 through FIG. 11. For example, FIG. 8 depicts spherical-shaped compliant supports 802, while FIG. 11 shows oval-shaped compliant supports 1102. These shapes facilitate translation and rotation of the battery 304 in situ. The spherical- and oval-shaped compliant supports may be made of suitable plastic or rubber material and filled with air, a suitable gel or other material. The spherical- and oval-shaped compliant supports are strong enough to support the weight of the battery. However, when pressed, the compliant supports 802 and 1102 break, thus allowing the battery 304 to be pressed to the PSA 104 as described above for bonding. In an embodiment, the gel may be an adhesive gel that comes in contact with the PSA 104 and the battery 304 and provides further bonding between the battery 304 and the PSA 104.

Figure 9:
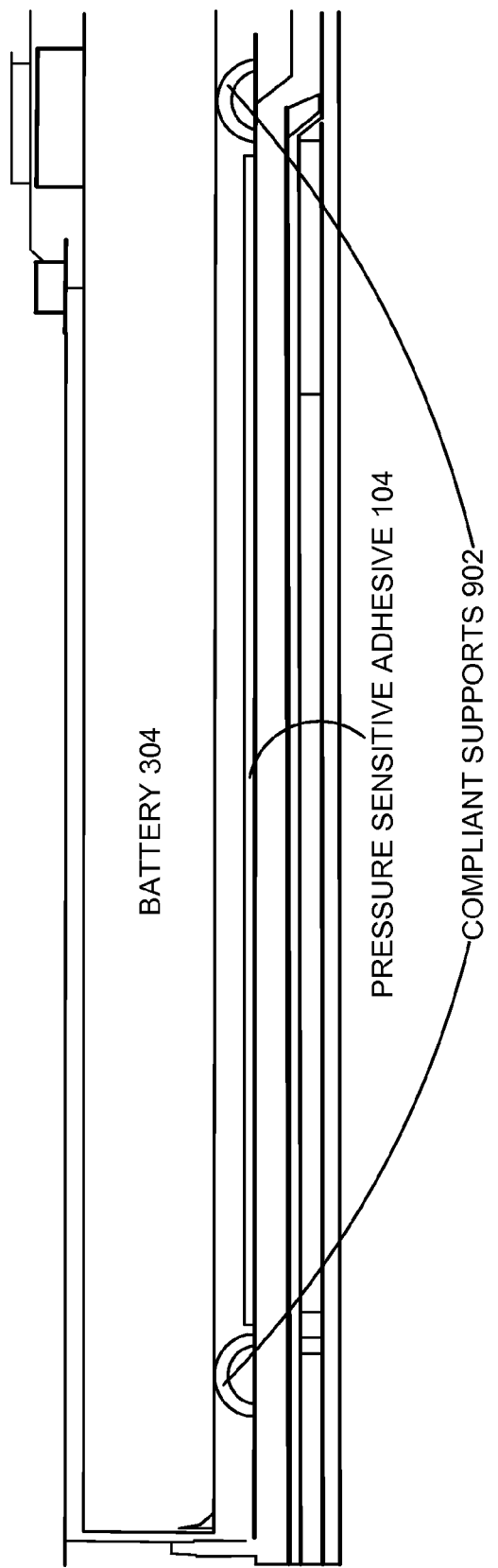
Figure 10:
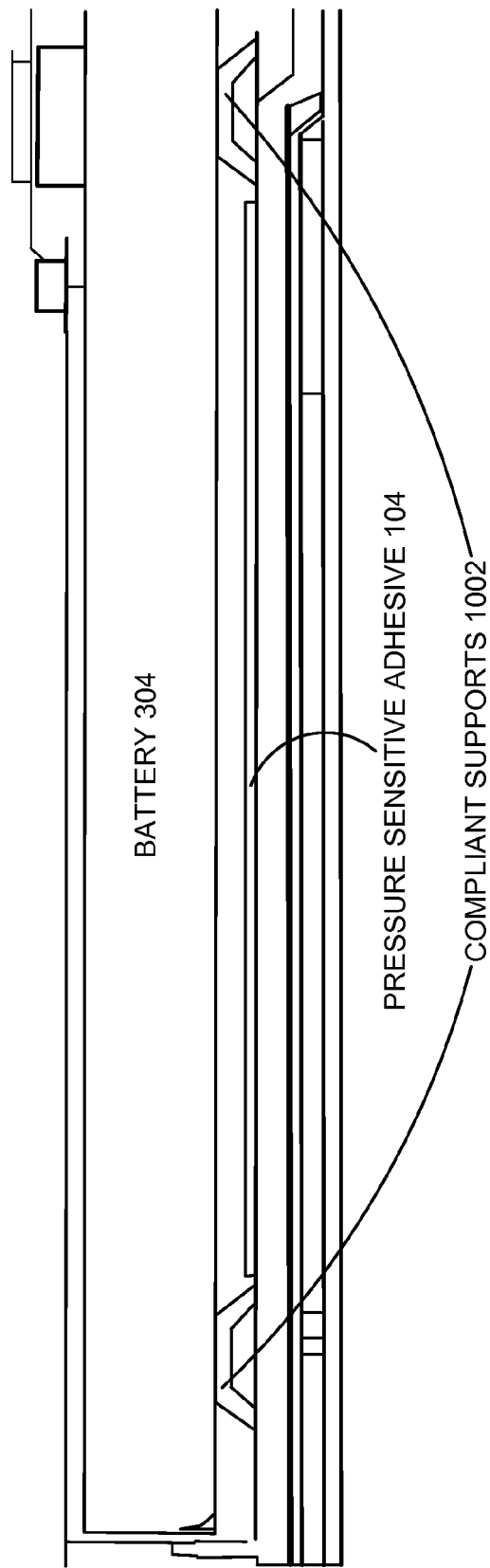
Figure 11:
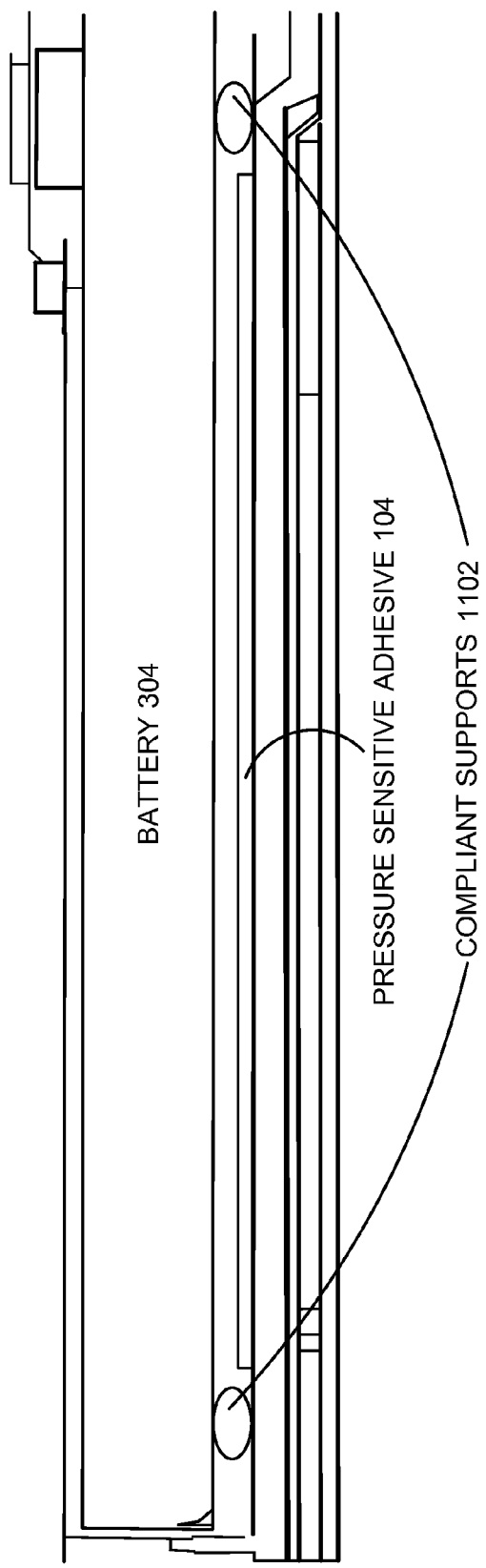

FIG. 9 and FIG. 10 show compliant supports fabricated from foam-like plastic material shaped into the form of legs that support the battery weight during testing, but flatten out under pressure and allow the battery 304 to be bonded to the battery enclosure 102 using the PSA 104. The shapes shown in FIGS. 8-11 are merely representative and a plurality of other shapes, sizes and materials are within the scope of the disclosure.

In some embodiments, a suitable adhesive is used to temporarily attach the compliant supports to the battery enclosure 102 and the battery 304 to the compliant supports. However, as discussed above, it is possible to remove the battery 304 from the battery enclosure 102 without any damage to any component.

Figure 12:
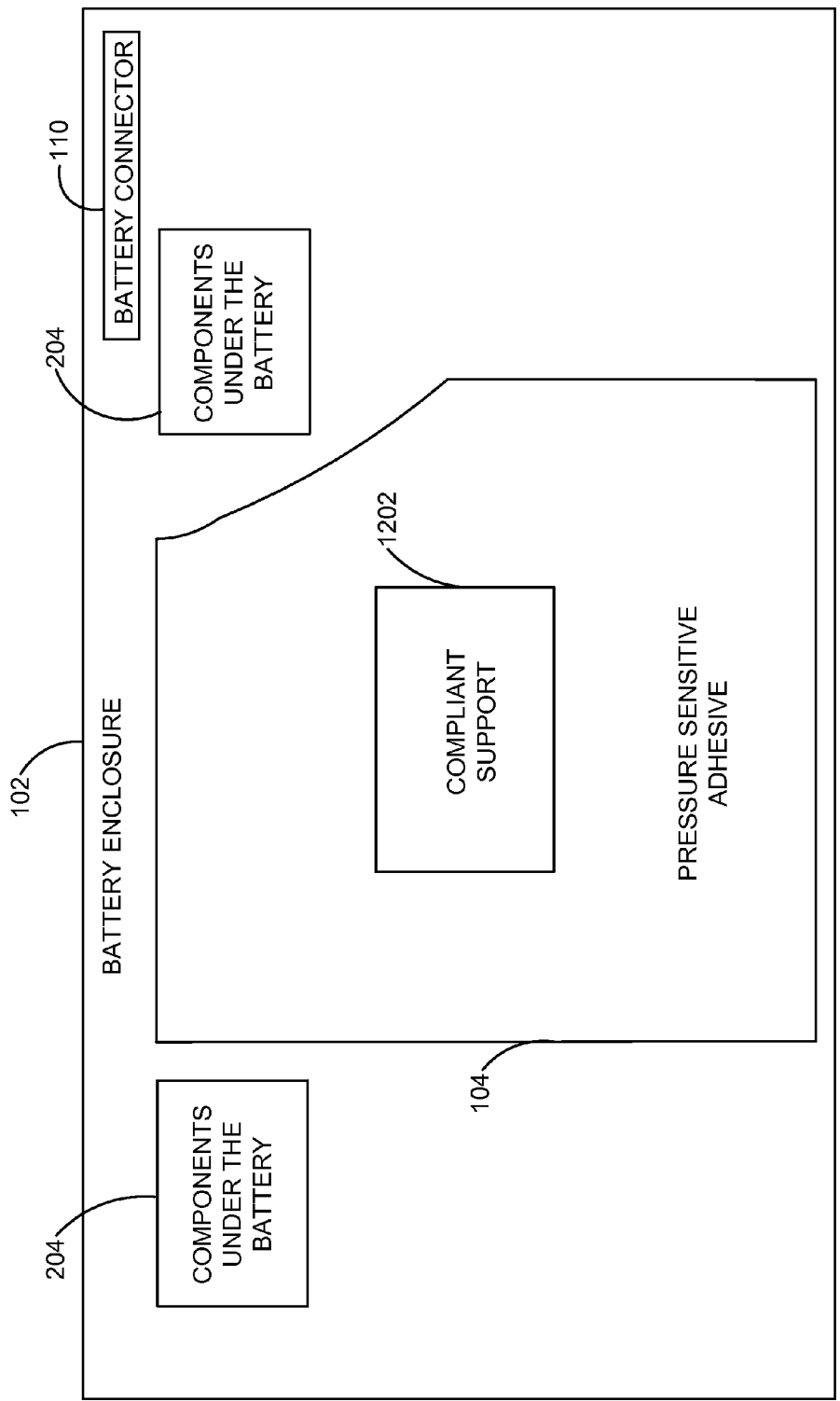
FIG. 12 is an exemplary schematic diagram illustrating another arrangement of a compliant support, where only one compliant support has been positioned close to the center of the battery enclosure to support the battery above the PSA.

FIG. 12 is an exemplary schematic diagram illustrating usage of only one compliant support 1202 supportably inserted inside the battery enclosure 102. In this exemplary embodiment, a single compliant support of suitable material with suitable size and shape, as described herein, is placed proximate to a center (e.g., central location) of the battery enclosure 102. The compliant support 1202 provides adequate upwards force to support the battery inside the battery enclosure 102 during functional testing. As discussed earlier, after satisfactory functional testing, suitable pressure is applied over the battery 304 to overcome the upwards force, compress the compliant support 1202, and bring the battery in contact with the PSA 104 for a pre-determined time period to bond the battery 304 to the battery enclosure 102. The duration of the pre-determined time period is dependent, at least, upon the particular PSA 104 applied to the battery enclosure 102.

Figure 13:
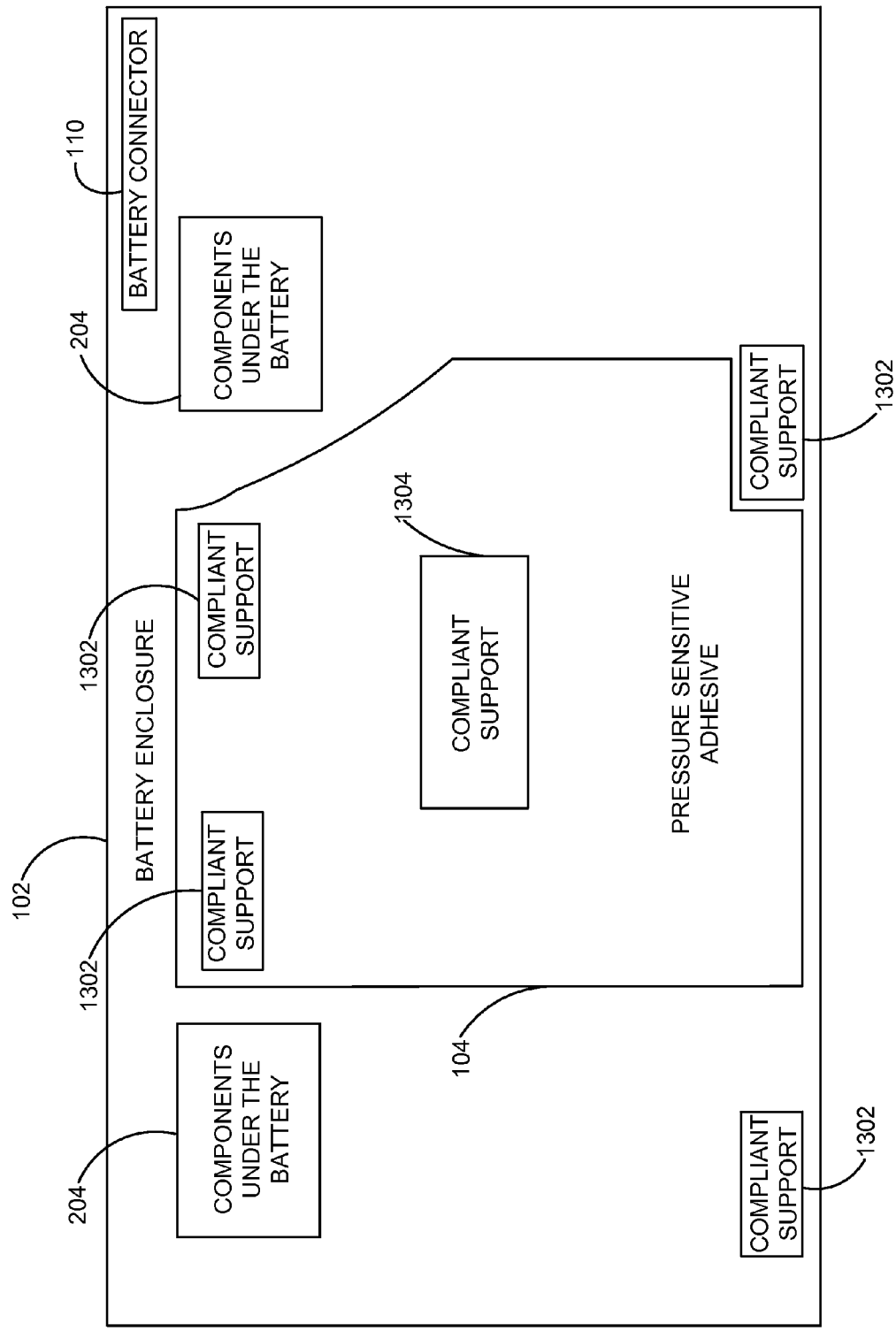
FIG. 13 is an exemplary schematic diagram illustrating another arrangement of compliant supports, where one compliant support has been positioned close to the center of the battery enclosure and four compliant supports have been placed around the battery enclosure to support the battery above the PSA.

FIG. 13 is an exemplary schematic diagram illustrating usage of multiple compliant supports supportably insertable inside the battery enclosure 102. In this embodiment, multiple compliant supports 1302 are placed at suitable locations inside the battery enclosure 102. Further, another compliant support 1304 is placed proximate to a central location inside the battery enclosure 102. Compliant supports 1302 and 1304 may be of different shapes, sizes and materials. In this embodiment, after satisfactory functional testing, one or more of the compliant supports 1302 may be removed, while other compliant supports 1304 may be kept inside the battery enclosure 102 before bonding the battery 304 to the battery enclosure 102 using the PSA 104.

Figure 14:
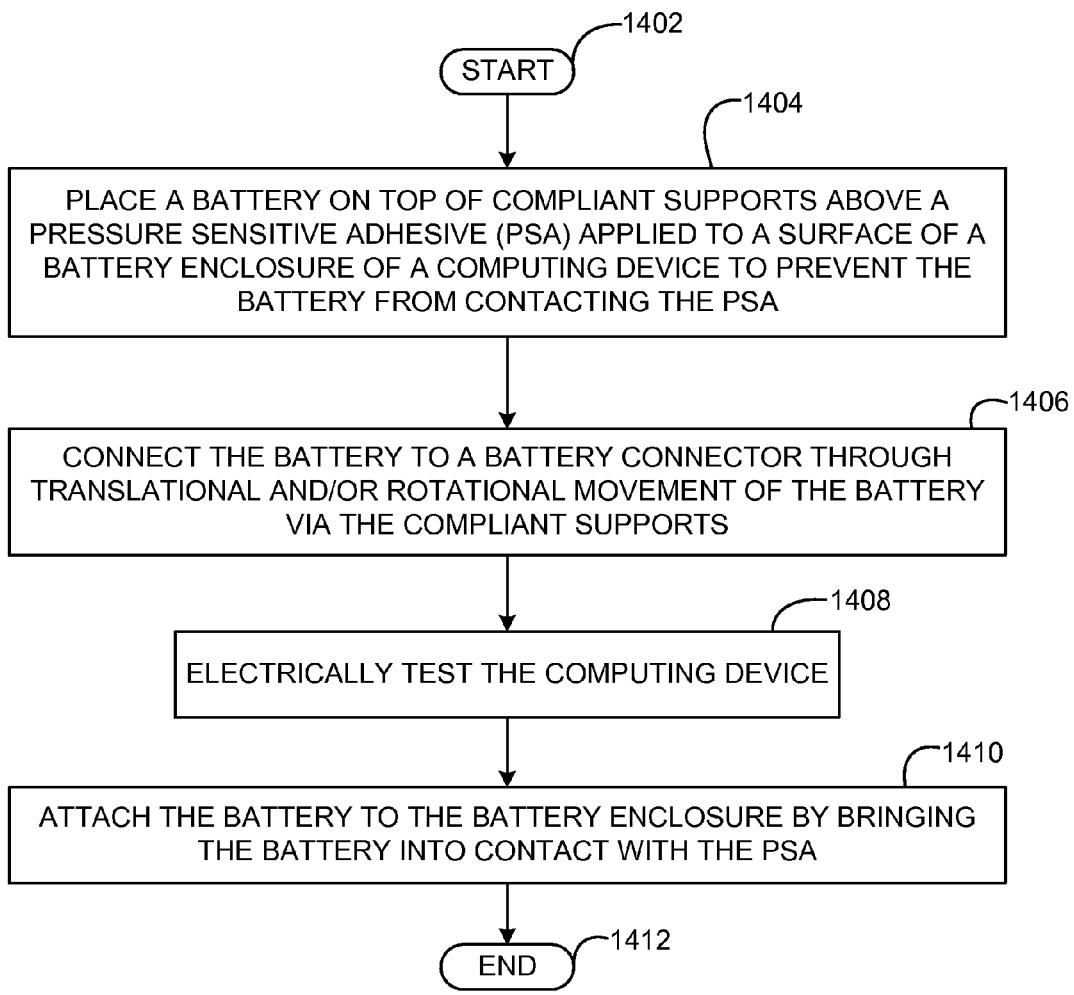
FIG. 14 is an exemplary flowchart illustrating an exemplary process of using the compliant supports to attach the battery to the battery enclosure to perform electrical testing and final fitment of the battery in the battery enclosure after electrical testing.

FIG. 14 illustrates a flowchart describing a method of assembling and electrically testing a computing device in accordance with some of the described embodiments. As shown in FIG. 14, the method begins at 1402. At 1404, a battery is placed on top of a plurality of compliant supports extending above PSA 104 applied to a surface of a battery enclosure of the computing device, the plurality of compliant supports preventing the battery from being in contact with the PSA 104. At 1406, the battery is connected to a battery connector through translational and/or rotational movement of the battery via at least one of the plurality of compliant supports. At 1408 electrical testing of the computing device is performed. At 1410, the battery is attached to the battery enclosure by pressing the battery into contact with the PSA 104, wherein pressing the battery overcomes a force generated by the plurality of compliant supports and brings the battery in contact with the PSA 104. At 1412, the method ends.

Figure 15:
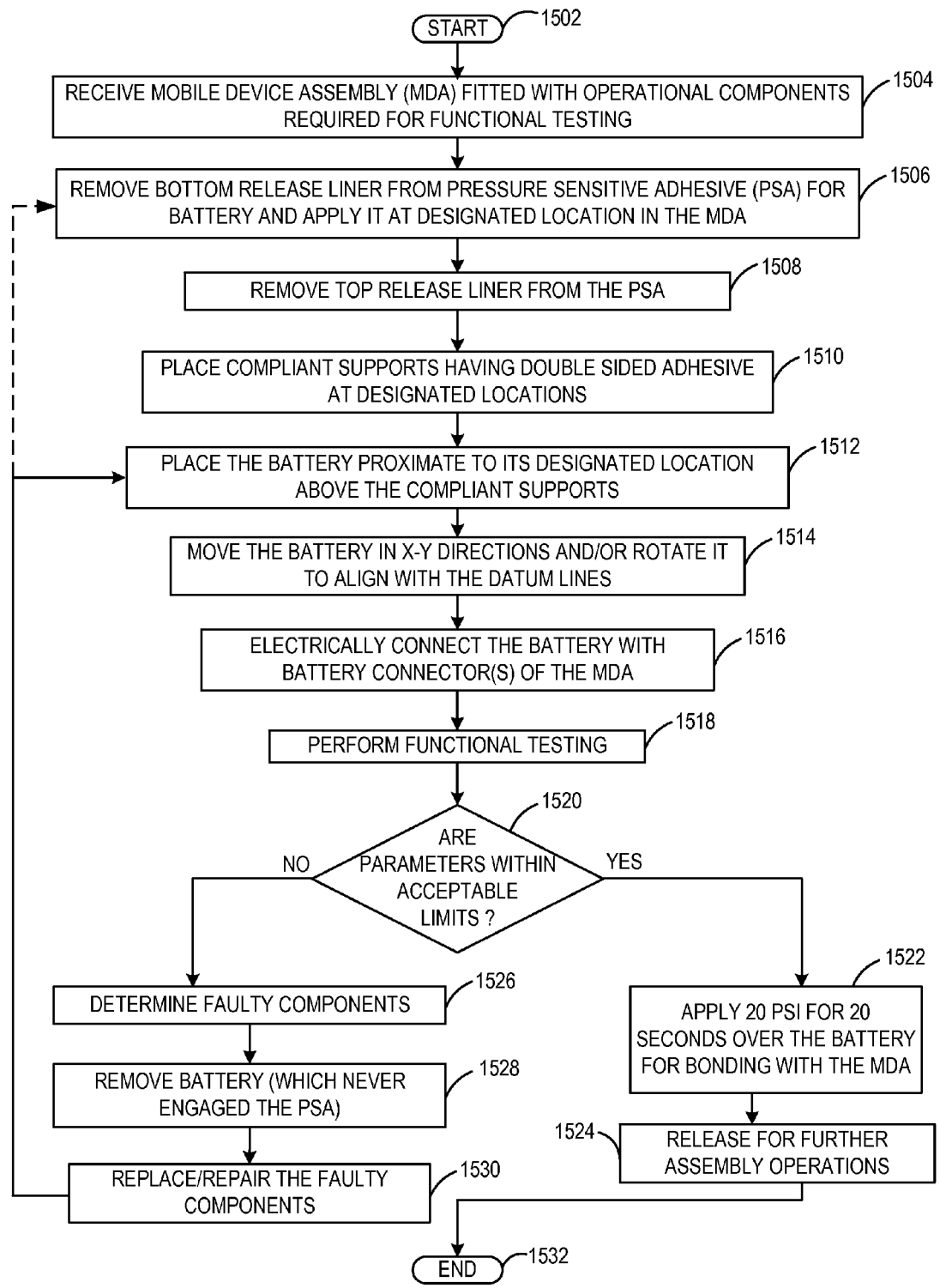
FIG. 15 is an exemplary flowchart illustrating an exemplary process of using the compliant supports to assemble the battery in a mobile device assembly (MDA) to perform functional testing and final fitment of the battery after satisfactory functional testing in the MDA.

FIG. 15 illustrates a flowchart describing a process of assembling and functional testing a computing device (e.g. a mobile device) before final assembly in accordance with some of the described embodiments. The testing at this stage before final assembly assures the quality of the mobile device as shipped to distributors and dealers, while at the same time provides an opportunity for rectification or other repairs if some parameters are found outside the acceptable limits. While the flowcharts depicts a plurality of operations, additional or fewer operations may be performed for functional testing in other embodiments of the disclosure.

As shown in the flowchart, the process of functional testing and final fitment of a battery begins at 1502. At 1504, a mobile device assembly (MDA) fitted with all operational components for functional testing is received. At this stage of the MDA, in some embodiments, the only uninstalled operational component needed to conduct the functional testing is the battery. Before placing the battery inside the MDA, PSA 104 is to be applied to the MDA. To facilitate this, at 1506, a bottom release liner is removed from the PSA 104 so that the PSA 104 bonds to the MDA when applying the PSA 104 to the designated location in the MDA. At 1508, a top release liner is removed from the PSA 104 so that when the battery is pressed to the PSA 104 for a pre-defined time period, the battery bonds to the PSA 104 which in turn is bonded to the MDA. In one embodiment, the PSA 104 is procured with top and bottom release liners attached to it so that the adhesive layers are protected during transportation and storage.

At 1510, compliant supports are placed at designated locations inside the MDA. The compliant supports may be of any suitable shape, size and material as described herein. In some embodiments, the compliant supports may have double-sided adhesive applied to them that facilitates temporarily sticking the compliant supports to the MDA and the battery. At 1512, the battery is placed inside the MDA above the compliant supports such that it is attached to the compliant supports but has axial movability in X-Y directions and rotational capability without detaching from the MDA or the compliant supports. The battery is placed proximate to its designated location but maneuvered at 1514 to align it to the datum lines that are provided, in some embodiments, inside the MDA to facilitate proper placement of the battery and its connection with a battery connector already installed inside the MDA.

At 1516, the battery is electrically connected to the battery connector already installed inside the MDA as a preparatory step to functional testing. At this stage, the MDA is ready for functional testing including testing of the battery in situ. At 1518, complete functional testing is conducted on the MDA to ensure that all the parameters of the mobile device are within acceptable limits. If, however, some parameters are found to be not within acceptable limits, it is easy to remove the battery without any damage to any component or the battery to perform repairs because the battery has not been permanently bonded to the MDA. The battery and other component may then be re-used after the repairs.

At 1520, the values of all the parameters tested during functional testing are compared to acceptable limits. If all the parameters are found to be within limits, the operation of bonding the battery to the MDA using the pre-applied PSA 104 is performed at 1522. In one exemplary embodiment, a pressure of 20 pounds per square inch (PSI) is applied above the battery for 20 seconds. The applied pressure and the time period may have suitable tolerance (e. g+1 PSI for the applied pressure and +1 second for the time period). However, the values of tolerances for the pressure and time period for application of pressure may vary depending on the properties of the PSA 104 and other factors. For example, values of pressure and time period of application varying by 20% are within an acceptable range in some embodiments. However, other values are within the scope of the disclosure. In some embodiments, a suitable fixture may be used to apply pressure evenly over the entire surface of the battery. At 1524, the MDA is released for further assembly operations. The functional testing and battery fitment operations end, in this example, at 1532.

However, if the values of some parameters are found to be outside the acceptable limits, the faulty components are identified at 1526. The battery may be kept in situ for fault-diagnosis. After fault-diagnosis, the battery is removed at 1528. Because the battery is placed on compliant supports, the battery may be easily removed without incurring damage. In one embodiment, the battery may be vertically lifted and detached from the compliant supports, while leaving the compliant supports in place so that the same compliant supports may be used again. In other embodiments, while removing the battery, the compliant supports may also be removed, and new compliant supports may be used after rectification. At 1530, rectification action is carried out by repairing or replacing the faulty components.

After rectification, functional testing is performed again. To facilitate functionally testing the MDA again, the operations beginning from 1506 or 1512 are performed again depending upon whether or not the compliant supports were removed during the operation of removing the battery.

Figure 16:
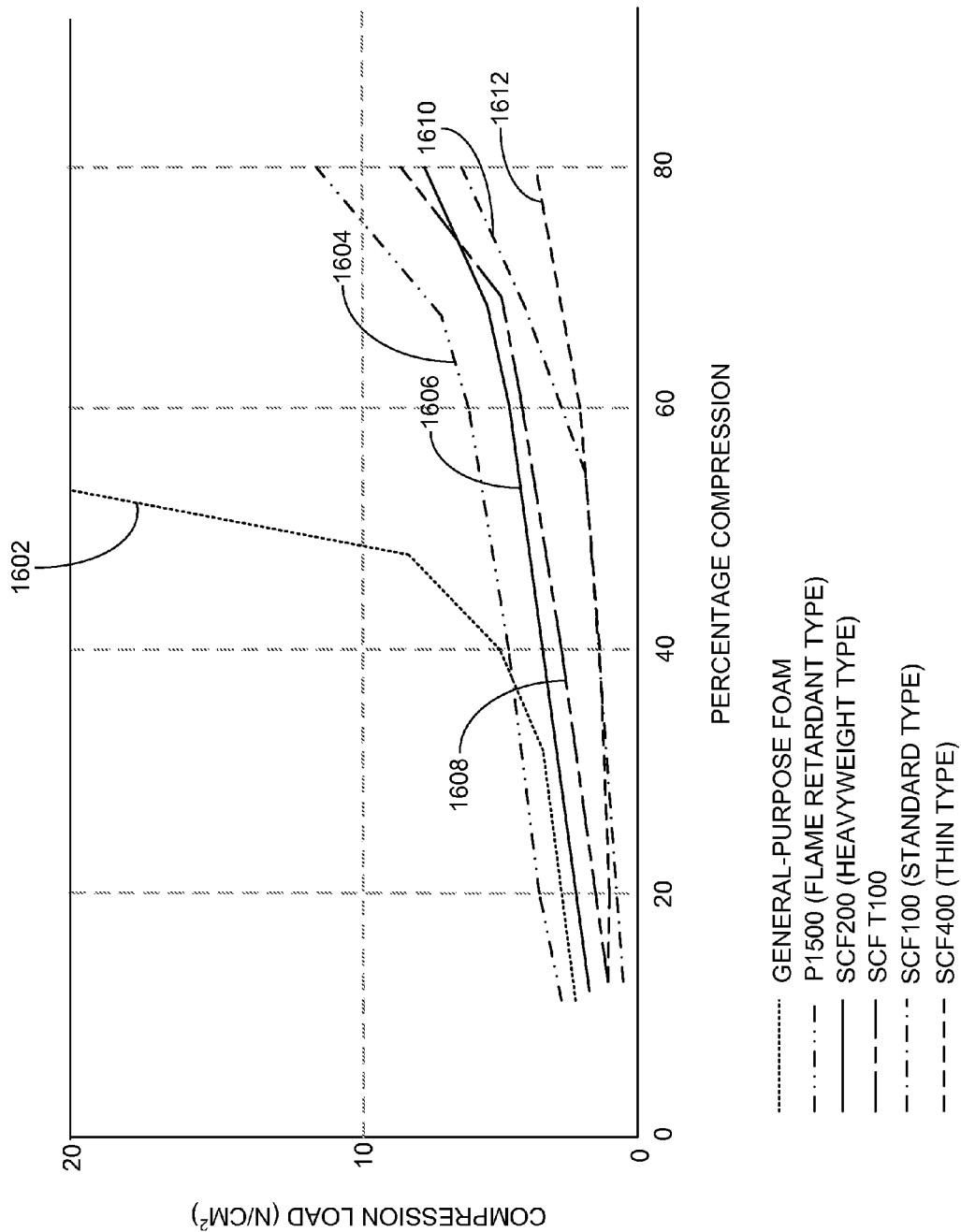
FIG. 16 is an exemplary diagram illustrating the compressive load and percentage compression of some of the foam types that may be used for fabricating the compliant supports.

FIG. 16 illustrates some of the exemplary materials that may be used to fabricate the compliant supports and their properties. At 1602, a general-purpose foam is shown. Other foams shown in FIG. 16 are available from Nitto Denko. At 1604. P1500, a flame-retardant foam is shown. At 1606, SCF200, a heavy-duty foam is shown. At 1608, SCF T100 that has a higher breaking strength is shown. At 1610, the SCF00 that is used in an exemplary embodiment is shown. At 1612, SCF400, a thin foam is shown. Depending upon the application demands, any of the above foam may be used for fabricating the compliant supports.

Aspects of the disclosure are operable with materials having various ranges of compression. For example, some embodiments have an acceptable range of compression of up to 75%.

ADDITIONAL EXAMPLES

In one embodiment, the compliant supports are in the form of breakaway supports of suitable material that support the weight of the battery, but breakaway and remain under the PSA 104 during bonding of the battery with the MDA after satisfactory functional testing.

In another embodiment, springs of a light, thin material are lightly attached to the MDA and the battery. The springs may be used as compliant supports to support the weight of the battery during functional testing but compress during bonding of the battery with the MDA after satisfactory functional testing.

While some embodiments have described bonding the battery 304 to the PSA 104 by pressing the battery 304 into the battery enclosure 102 and compressing the compliant supports 202. other embodiments are contemplated. For example, rather than using pressure, the compliant supports 202 may compress, collapse, and/or disintegrate in response to the application of sound (e.g., ultrasound), light (e.g., ultraviolet light), electrical current, and/or heat. Further, the compliant supports 202 may be pulled from the battery enclosure 102 using a tool. Alternatively or in addition, the compliant supports 202 may be formed from self-assembling microelectromechanical systems (MEMS) or using nanotechnology.

The embodiments illustrated and described herein as well as embodiments not specifically described herein but within the scope of aspects of the invention constitute exemplary means for assembling and testing the computing device. For example, some embodiments include PSA means disposed along a surface of the battery enclosure 102, compliant support means disposed along the surface with at least a portion of the compliant support means extending above the PSA means, and battery connector means for receiving the battery.

Embodiments of the disclosure are operable with any general purpose or special purpose computing system environments, configurations, or devices. Examples of well-known computing systems, environments, and/or configurations that may be suitable for use with aspects of the disclosure include, but are not limited to, mobile computing devices, personal computers, server computers, hand-held or laptop devices, multiprocessor systems, gaming consoles, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices. and the like.

The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before. contemporaneously with, or after another operation is within the scope of aspects of the disclosure.

When introducing elements of aspects of the disclosure or the embodiments thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A computing device comprising an enclosure, the enclosure comprising:
   pressure sensitive adhesive (PSA) on a surface of the enclosure;
   a compliant support disposed along the surface, the compliant support axially extending from the surface beyond the PSA and being compressible axially from a first orientation to a second orientation upon force being applied to a distal end of the compliant support; and
   a battery connector,
   the compliant support being configured to:
      at the first orientation, receive a battery for connection to the battery connector, facilitate at least translational movement of the battery when connecting the battery to the battery connector, and hover the battery above the PSA, and
      at the second orientation, bring the battery into contact with the PSA without removing the compliant support.

2. The computing device of claim 1, wherein the compliant support is a first compliant support, the computing device further comprising a second compliant support.

3. The computing device of claim 2, wherein the first and second compliant supports are disposed at two locations inside the enclosure.

4. The computing device of claim 1, wherein the compliant support is further configured to facilitate alignment of the battery to the enclosure.

5. The computing device of claim 1, wherein the compliant support is formed from compressible foam and has a rectangular shape.

6. The computing device of claim 1, wherein the compliant support is shaped to accommodate the battery while maintaining a gap between the battery and the PSA in the first orientation.

7. The computing device of claim 1, wherein upon application of a first force, the compliant support transitions from the first orientation to the second orientation.

8. The computing device of claim 7, wherein the compliant support is configured to form a planar surface for receiving the battery, and wherein the compliant support is configured to produce a second force orthogonal to the planar surface to prevent the battery from touching the PSA until application of the first force.

9. The computing device of claim 1, wherein the computing device comprises at least one of a tablet computing device, a mobile telephone, a gaming console, or a laptop.

10. An enclosure comprising:
    pressure sensitive adhesive (PSA) on a surface of the enclosure; and
    one or more compliant supports disposed along the surface, at least a portion of each of the one or more compliant supports axially extending from the surface beyond the PSA, the one or more compliant supports being axially compressible between:
       a first orientation in which the one or more compliant supports hold a battery above the PSA to prevent the battery from contacting the PSA, and
       a second orientation in which the battery touches the PSA while at least one of the one or more compliant supports is retained in the enclosure.

11. The enclosure of claim 10, wherein the compliant supports are constructed of at least one of foam, rubber filled with gel, or air-filled plastic sac.

12. The enclosure of claim 10, wherein one of the compliant supports is placed proximate to a central location inside the enclosure and the other compliant supports are placed at outlying locations inside the enclosure.

13. The enclosure of claim 12, wherein the compliant support proximate to a central location inside the enclosure is configured to be retained in the second orientation and the outlying compliant supports are removed from the enclosure upon the battery touching the PSA.

14. A method for assembling and testing a computing device, the method comprising:
- placing a battery on top of a plurality of compliant supports extending above a pressure sensitive adhesive (PSA) applied to a surface of an enclosure of a computing device, the plurality of compliant supports maintaining a gap between the battery and the PSA;
- connecting the battery to a battery connector through at least translational movement of the battery via at least one of the plurality of compliant supports;
- electrically testing the computing device; and
- after electrically testing the computing device, attaching the battery to the enclosure by bringing the battery into contact with the PSA without removing the plurality of compliant supports from the enclosure.

15. The method of claim 14, wherein the battery is maintained in engagement with the plurality of compliant supports but not the PSA during electrical testing of the computing device.

16. The method of claim 14, wherein the plurality of compliant supports apply a force against the battery to prevent the battery from contacting the PSA during electrical testing of the computing device.

17. The method of claim 14, wherein bringing the battery into contact with the PSA comprises pressing the battery to overcome a force generated by the plurality of compliant supports.

18. The method of claim 17, wherein pressing the battery comprises applying a downward force to the battery to move the battery into an interior portion of the enclosure.

19. The method of claim 14, wherein attaching the battery comprises bonding the battery to the enclosure.

20. The method of claim 14, wherein connecting the battery to the battery connector comprises moving the battery along the plurality of compliant supports to substantially align a part of the battery with the battery connector.

* * * * *